(12) United States Patent
Jentzsch et al.

(10) Patent No.: US 12,405,842 B2
(45) Date of Patent: Sep. 2, 2025

(54) APPARATUS AND METHOD FOR SYNCHRONIZING PARTICIPANTS OF A SIMULATION

(71) Applicant: MINRES Technologies GmbH, Neubiberg (DE)

(72) Inventors: Eyck Jentzsch, Neubiberg (DE); Andreas Koch, Darmstadt (DE)

(73) Assignee: MINRES Technologies GmbH, Neubiberg (DE)

( * ) Notice: Subject to any disclaimer, the term of this patent is extended or adjusted under 35 U.S.C. 154(b) by 101 days.

(21) Appl. No.: 18/382,086

(22) Filed: Oct. 20, 2023

(65) Prior Publication Data

US 2024/0134718 A1 Apr. 25, 2024
US 2024/0231956 A9 Jul. 11, 2024

(30) Foreign Application Priority Data

Oct. 20, 2022 (EP) ..................................... 22202781

(51) Int. Cl.
*G06F 9/52* (2006.01)
(52) U.S. Cl.
CPC ....................................... *G06F 9/52* (2013.01)
(58) Field of Classification Search
CPC ................................ G06F 9/52; G06F 30/331
See application file for complete search history.

(56) References Cited

U.S. PATENT DOCUMENTS

| 6,145,099 | A  | * | 11/2000 | Shindou ............... | G06F 11/3636 |
| | | | | | 714/E11.215 |
| 9,529,662 | B1 | * | 12/2016 | Wangkhem ......... | G06F 11/0709 |
| 11,321,507 | B1 | * | 5/2022 | Chang ................. | G06F 30/3323 |
| 11,327,790 | B1 | | 5/2022 | Gaur et al. | |

(Continued)

OTHER PUBLICATIONS

Seok, Moon GI et al., "An HLA-based Formal Co-simulation Approach for Rapid Prototyping of Heterogeneous Mixed-signal SoCs", IEICE Transactions on Fundamentals of Electronics, Communications and Computer Sciences, (online), vol. E100 No. 7, Jan. 1, 2017, 11 pages.

(Continued)

*Primary Examiner* — Faisal M Zaman
(74) *Attorney, Agent, or Firm* — Christensen, Fonder, Dardi & Herbert PLLC

(57) ABSTRACT

An apparatus for synchronizing participants of a simulation, including: a plurality of partitions, a backplane, and a synchronizer. Each partition is configured to run a respective simulation participant independently from other simulation participants. The backplane connects the plurality of partitions and is configured to transfer data between the plurality of partitions. The data include time stamps indicating a partition time of a simulation participant on at least one partition. The synchronizer is configured to synchronize the multiple partitions by stopping the running simulation participant of the at least one partition, when a time stamp of the running simulation participant is outside a synchronization window. The synchronization window has a predetermined (Continued)

time length indicating a range of acceptable time stamps (T1, T2) and starts with time (T0) associated with a time stamp of a slowest running simulation participant.

11 Claims, 9 Drawing Sheets

(56) References Cited

U.S. PATENT DOCUMENTS

| | | | | |
|---|---|---|---|---|
| 2002/0162059 | A1* | 10/2002 | McNeely | H04L 43/50 714/724 |
| 2002/0169863 | A1* | 11/2002 | Beckwith | G06F 30/20 709/223 |
| 2008/0091403 | A1* | 4/2008 | Harrison | G06F 30/33 703/17 |
| 2013/0124607 | A1* | 5/2013 | Griffith | H04L 43/50 709/203 |
| 2013/0151220 | A1* | 6/2013 | Matsumura | G06F 30/20 703/7 |
| 2015/0019193 | A1* | 1/2015 | Boutillier | G06F 30/367 703/14 |
| 2017/0206247 | A1* | 7/2017 | Gusev | G06F 16/2455 |
| 2019/0308104 | A1* | 10/2019 | Nicolades | A63F 13/35 |
| 2020/0057707 | A1* | 2/2020 | Jiang | G06F 11/261 |
| 2020/0272533 | A1* | 8/2020 | Privitt | G06F 11/1637 |
| 2021/0365328 | A1* | 11/2021 | Zimring | F16L 55/48 |
| 2021/0376994 | A1* | 12/2021 | Zan | G06F 1/12 |
| 2022/0111517 | A1* | 4/2022 | Bennice | B25J 9/1605 |
| 2022/0244978 | A1* | 8/2022 | Dale | G06F 9/45558 |
| 2022/0374260 | A1* | 11/2022 | Zhang | G06F 9/4843 |
| 2023/0076849 | A1* | 3/2023 | Matsuoka | G06Q 10/06316 |

OTHER PUBLICATIONS

Steinman, Jeff S., "Interactive SPEEDES", Simulation Symposium, Apr. 1, 1991, Proceedings of the 24th Annual New Orleans, LA, USA, Apr. 1-5, 1991, Los Alamitos, CA, USA, IEEE Comput. Soc, pp. 149-158.

Wilsey, Philip A., "Time Warp Simulation on Multi-Core Platforms", 2019 Winter Simulation Conference (WCS), IEEE, Dec. 8, 2019, pp. 1454-1468.

* cited by examiner

APPARATUS AND METHOD FOR SYNCHRONIZING PARTICIPANTS OF A SIMULATION

PRIORITY CLAIM

The present application claims priority to European Patent Application No. 22 202 781.5, filed on Oct. 20, 2022, which said application is incorporated by reference in its entirety herein.

FIELD OF THE INVENTION

The present invention relates to an apparatus and a method for synchronizing participants of a simulation and, in particular, to a loosely coupled parallel simulation of a designs of a register transfer logic on reconfigurable logic devices using a time window synchronization.

BACKGROUND OF THE INVENTION

When designing computer chips, the design shall be checked for functionality before a possibly very cost-intensive chip fabrication. Since software-based simulations are typically very slow, especially for more complex designs, an alternative would be to map the description of the hardware design at a register transfer logic (RTL) level onto reconfigurable logic devices such as field-programmable gate arrays (FPGAs), on which the designs can now run in a faster emulated fashion. However, even large currently available FPGAs do not have sufficient capacity to accommodate very complex chip designs in only one FPGA. Therefore, the design is divided among several FPGAs and the communication links are switched among them. However, such systems are very complex and therefore expensive.

Therefore, there is a need to increase the productivity of the development of complex hard-ware/software systems and, in particular, a need to simulate designs while allowing an efficient communication between the components and to provide flexible possibilities to adapt the simulation to very complex systems.

SUMMARY OF THE INVENTION

At least some of the above-mentioned problems are solved by an apparatus for synchronizing participants of a simulation according to the claims and a corresponding method according to the claims.

The present invention relates to an apparatus for synchronizing participants of a simulation. The apparatus comprises a plurality of partitions, a backplane, and a synchronizer. Each partition is configured to run a respective simulation participant independently from other simulation participants. The backplane is configured to connect the plurality of partitions and is configured to transfer data between the plurality of partitions. The data may include time stamps indicating a partition time of a simulation participant on at least one partition. The synchronizer is configured to synchronize the multiple partitions by stopping the running simulation participant of the at least one partition, when a time stamp of the running simulation participant is outside a synchronization window. The synchronization window has a predetermined time length indicating a range of acceptable time stamps and starts with a time associated with a time stamp of a slowest running simulation participant.

The synchronizer may be any synchronization device, which may also be implemented by a particular installed software in a data processing device. Moreover, the subject of the simulation is a particular chip design, wherein the chip might be partitioned into various functional components (e.g., the partitions of the simulation). According to embodiments, the design of the chip is simulated (tested) before it is manufactured in order to optimize the various components to achieve a maximal performance and/or to use minimal resources of/for the manufactured chip. The synchronizer controls the timing of the simulation in all partitions and is accommodated in the backplane. Therefore, according to embodiments, the synchronization takes not place in the partitions (i.e., decentralized). Rather, a centralized synchronization for all partitions is performed in the backplane by utilizing a window so that each partition can proceed with the simulation only upon granting a respective request sent to the synchronizer.

According to embodiments, the simulation may test a hardware before manufacturing (e.g. as a monolithic chip in silicon). The tested hardware may be a complex chip (e.g. a system on chip, SoC) which may be divided in subcomponents (partitions). During the simulation, to test the exemplary chip of interest, these subcomponents are realized or implemented in hardware such as an FPGA or in a software emulation. In the following, each of these components may also be called a device under test (DUT), because each partition may be seen as a means for testing of hardware components having, e.g., a designated purpose.

Therefore, optionally, the backplane comprises the synchronizer and the plurality of partitions includes at least one of the following sets:
  a set of field programmable gate arrays, FPGA,
  a set of virtual platform simulation partitions.

The apparatus may be or include a computer or a data processing unit. However, the apparatus is not a dedicated simulation processing unit, but may represent a heterogeneous complex system comprised of independently operating units (partitions) being in communication with each other through a generic backplane. In particular, the synchronizer is outside or external to the partitions. In addition, each partition may include its own synchronizer and/or a scheduler to provide a timing for jobs to be carried out on the respective partition. However, these synchronizers/schedulers are different from the synchronizer of the apparatus which facilitates a synchronous structure between the separate partitions of the exemplary heterogeneous complex system.

Optionally, the synchronizer may be configured to issue an approval of a request for updating a simulation time of a simulation participant (only) when the updated simulation time is inside the synchronization window.

Optionally, the synchronizer is further configured to allow a stopped simulation participant to resume its operation upon receiving an external transaction. For example, when the simulation shall be stopped, all partitions may be started again to gracefully exit thereafter.

Optionally, the apparatus further comprises one or more messaging interfaces to provide connections between the partitions and the backplane. The messaging interfaces may include an output connector and/or an input connector for mapping a generic message structure of the backplane to a design specific interfaces of the respective partitions. Therefore, the messaging interface(s) may map a generic message structure to design specific interfaces (e.g. of the partitions). The generic message structure advantageously allows the communication between hardware designs with arbitrary interfaces (e.g. of various FPGA partitions) and may enable a seamless interaction with the virtual components modeled in software (e.g. of the virtual platform simulation partitions).

According to embodiments, the mapping on hardware interface between a generic data structure and a design specific data structure is performed over many abstraction levels (e.g. between pin levels of the register transfer logic, RTL) on the partitions and the generic message structure utilized on the backplane.

Optionally, each partition may comprise a respective messaging interface, wherein each messaging interface is configured:
  to receive, at the output connector at a beginning of the simulation, a name of the input connectors being possible destinations of messages; and/or
  to register the output connector at the input connector.

Optionally, each input connector comprises an asynchronous buffer to buffer data and provide them when the respective partition needs the buffered data. The buffer at the interface may include a first-in-first-out (FIFO) structure, which will ensure that no data (e.g. transactions, messages) are lost.

Optionally, each partition comprises a scheduler. The scheduler may be configured to schedule jobs of the respective simulation participant based on time stamps independently from other simulation participants. The synchronizer may be configured to allow the scheduler to freely schedule the jobs as long as the time stamps are inside the synchronization window. Internally, the partitions may handle their jobs (threads) freely.

Optionally, the synchronizer is configured to cause at least one of the following:
  to define or to determine a number of simulation participants;
  to register each simulation participant;
  to align all simulation participants at a beginning and/or the end of the simulation.

Therefore, the participants are known to each other (e.g. by name). Similarly, all connectors (input and output) may register each other.

Optionally, the synchronizer is adapted to set the predetermined time length of the synchronization window to at most 25 ms or at least 5 ms or about 10 ms, or use such windows. However, these are only examples. The synchronizer may be free to set any predetermined value for the time length of the synchronization window. The size of the synchronization window can be selected freely and may be adapted to optimize the simulation according to the needs (e.g. with respect to the time). The synchronization window may, in particular, a synchronously running window, which proceeds or moves with the speed of the slowest participant (slowest partition).

Embodiments relate also to a computer-implemented method for synchronizing a simulation running on multiple partitions of a heterogeneous complex system. The simulation comprises simulation participants on the multiple partitions. The method comprises:
  running in parallel the simulation participants on the multiple partitions;
  transferring data between the partitions, the data including time stamps indicating a partition time of a simulation participant on at least one partition;
  defining a synchronization window of predetermined time length indicating a range of acceptable time stamps;
  synchronizing the multiple partitions by pausing the running simulation participant of the at least one partition, when a time stamp of the running simulation participant is outside the synchronization window.

According to further embodiment, one or more or all steps of the method may be carried out by a remote cloud computing unit. In addition, one or more steps may be repeated and the order of steps may be different to achieve the desired effect.

This method may also be implemented in software or as a computer program product. Embodiments of the present invention can, in particular, be a data processing system or may be implemented by software or a software module in a computing unit. Therefore, embodiment relate also to a computer program product or computer-readable storage device having a program code for performing the method, when the program code is executed on a processor.

Embodiments overcome at least some of the above-mentioned problems by a heterogeneous parallelization allowing a simulation of complex systems built from several subsystems. Advantageously, the subsystems are well encapsulated, have clear interfaces and relatively little communication between them. This makes it possible to partition a system at subsystem boundaries and flexibly emulate the individual partitions, for example, on multiple FPGAs. Embodiments allow to run a part of the design partly as hardware emulation (e.g. on reconfigurable logic devises) and partly as software simulation. Moreover, embodiments provide an infrastructure not only supporting off-the-shelf FPGA expansion cards for local on-premise simulation, but can also be de-ployed in the Cloud (on a remote cloud computing device). Likewise, embodiments provide an infrastructure for communication and synchronization of multiple FPGAs.

Particularly, instead of the proprietary prototyping or emulation systems of conventional systems, embodiments implement a generic synchronization logic that connects the different parts (partitions) of the partitioned chip design via a (generic) bus system ('backplane'). This allows to couple an arbitrary number of partitions implemented by exemplary FPGAs and/or virtual software emulations without providing fixed interconnections between the partitions. Both industrially available, relatively inexpensive FPGA accelerator cards and inexpensive cloud resources can be used for this.

Embodiments provide various advantages. These includes, inter alia, the scalability using FPGA resources that can be acquired at low cost or be utilized even in a rental model. Thus, the costs can significantly be reduced when compared to known prototyping/emulation systems of comparable power and performance. Moreover, the split between FPGAs and software emulation provides the opportunity to distribute the simulation participant in accordance to their performance. A slow running simulation participant may run on a FPGA partition and a fast running simulation participant may be implemented on a software emulation partition, or vice versa. The system provides all flexibility needed.

BRIEF DESCRIPTION OF THE DRAWINGS

Various embodiments of the present invention will be described in the following by way of examples only, and with respect to the accompanying drawings, in which.

DETAILED DESCRIPTION

Various examples will now be described more fully with reference to the accompanying drawings in which some examples are illustrated.

Accordingly, while examples are capable of various modifications and alternative forms, the illustrative examples in the figures will herein be described in detail. It should be understood, however, that there is no intent to limit examples to the particular forms disclosed, but on the contrary, examples are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing illustrative examples only and is not intended to be limiting. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements and/or components, but do not preclude the presence or addition of one or more other features, steps, operations, elements, components and/or groups thereof.

Unless otherwise defined, all terms (including technical and scientific terms) used herein have the same meaning as commonly understood by one of ordinary skill in the art to which examples belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Figure 1:
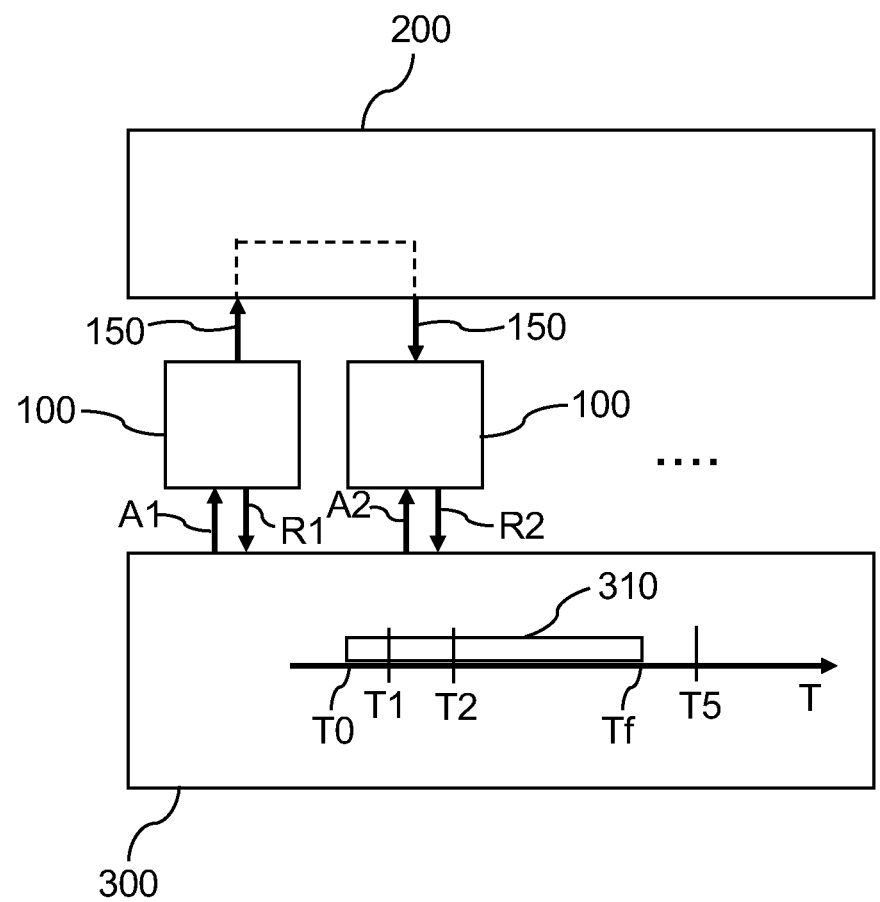
FIG. 1 depicts an apparatus for synchronizing participants of a simulation according to an embodiment system.

FIG. 1 depicts an apparatus according to an embodiment for synchronizing participants of a simulation (e.g. of a chip design) that it partitioned into parts. The apparatus comprises a plurality of partitions 100, wherein each partition 100 is configured to run a respective simulation part (participant) independently from other simulation participants. The simulation parts may run in parallel or simultaneously.

The apparatus further comprises a backplane 200 that connects the plurality of partitions 100. The backplane 200 is configured to transfer data 150 such as messages or transactions between the plurality of partitions 100. The data 150 may include time stamps indicating a partition time of a simulation participant on at least one partition 100. The backplane 200 may implement a bus system to facilitate interactions between the partitions 100. It forms a basis for other parts and can be implemented both in hardware, e.g. via PCIe, or in software as a C++ library. The backplane 200 maintains information about all partitions 100 and thus enables the interconnection between them.

According to embodiments, the backplane is generic (i.e. not application specific) and can be realized in hardware or software.

The apparatus further comprises a synchronizer 300 to synchronize the multiple partitions 100. For this, a running simulation participant of at least one partition 100 can be stopped, when a time stamp T5 of the running simulation participant is outside a synchronization window 310. The synchronization window 310 has a predetermined time length indicating a range of acceptable time stamps and starting with time T0 associated with a time stamp of a slowest running simulation participant. The time length can be adjusted to a particular simulation (e.g. in a range between 1 ms and 100 ms), but within a given simulation it will be predetermined (e.g. constant or modified in a defined manner). Therefore, the participants of the simulation are synchronized by utilizing this synchronization window. As long as the participants stay "inside" the synchronization window, the simulation participants can run freely, but they will be blocked by the synchronizer from proceeding to fast (e.g., when a time stamp is too far in the future). The pace of the simulation may be set by the slowest simulation participant.

The synchronization 300 may be implemented as separate component as shown in FIG. 1. However, advantageously, synchronization device 300 can also be integrated or being part of the backplane 200 which provides the advantage the backplane 200 can block any routing of data from/to participant and thus stops effectively the respective participant.

The parallelization is based on the ability to divide the system, e.g. based on the architectural features like CPU's or other components that are as independent as possible. The resulting partitions 100 may define each a device under test (DUT) that are simulated in parallel, e.g. by running on an FPGA and/or as software thread on virtual emulation.

Figure 2:
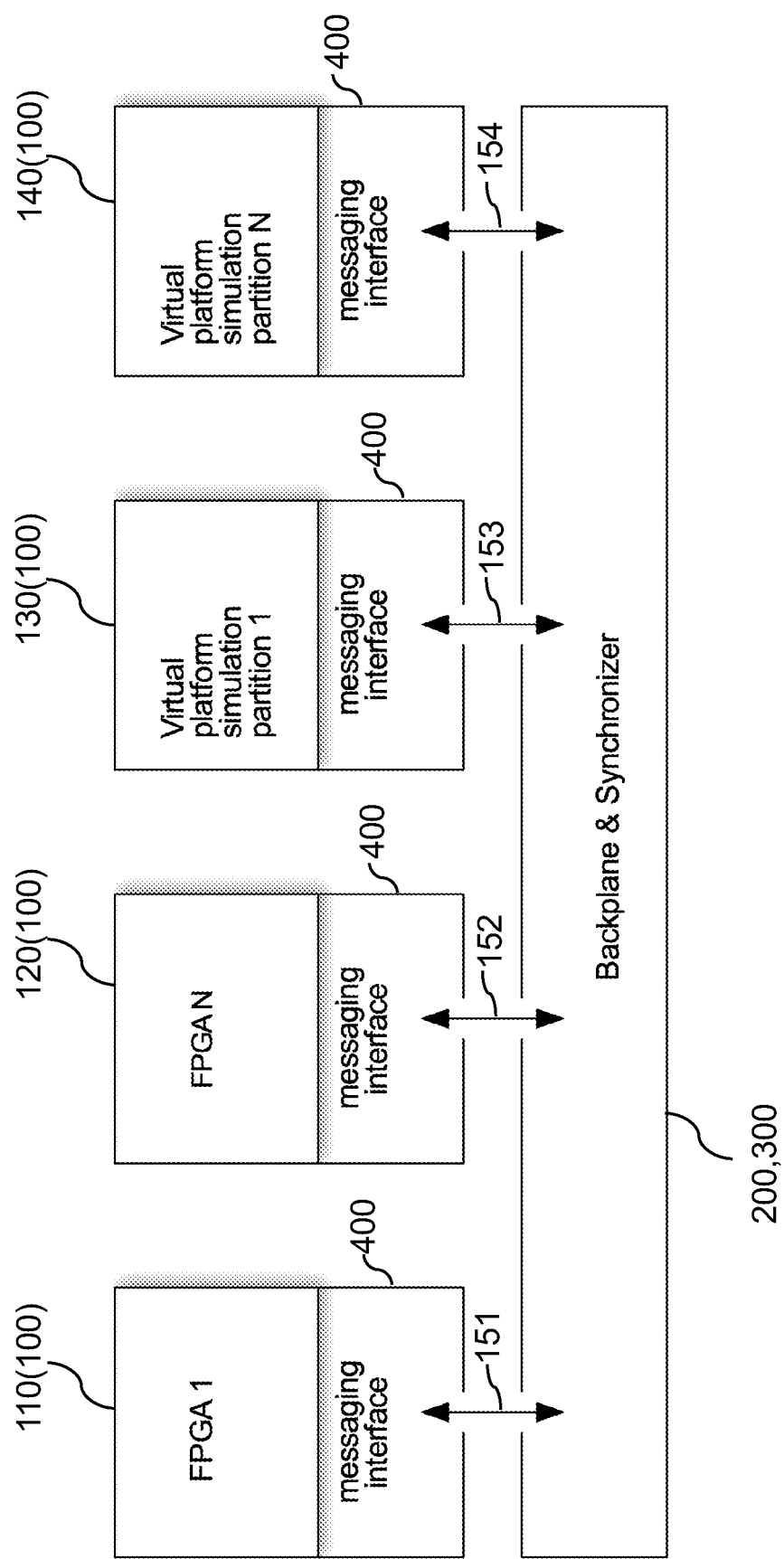
FIG. 2 depicts an infrastructure utilized by embodiments.

FIG. 2 depicts an infrastructure utilized by embodiments. The infrastructure connects all partitions 110, 120, 130, 140 with each other and enables exchange of data 151, 152, 153, 154 and the synchronization between the individual partitions 110, 120, 130, 140. As an example, FIG. 2 shows for the partitions 100 only two FPGAs 110, 120 and only two virtual platform simulations 130, 140. However, in general, there can be any number of FPGAs 110, 120 and/or any number of virtual platform simulation 130, 140 (i.e. the indicated numbers N can be 1, 2, 3, . . . ). Likewise, both numbers can be different implying that the number of FPGAs 110, 120 can be different from the number of virtual platform simulation 130, 140. The infrastructure comprises three main parts:
- a backplane 200—which provides the infrastructure for inter-partition communication;
- messaging interfaces 400—which provide connectors utilized to connect individual components 100 of the multi-partition simulation to and from the backplane 200; and
- the synchronizer 300, which controls the simulation time in all partitions.

According to embodiments, the message interfaces 400 implementing the communication between the partitions 100 are generic message interface connectors 400 that map generic messages to design specific interfaces of the partitions 100. The generic message structure allows the communication between hardware designs with arbitrary interfaces (e.g. of different FPGA partitions 110, 120) and may enable a seamless interaction with the virtual components modeled in software (e.g. of the virtual platform simulation partitions 130, 140).

In this embodiment, the synchronizer 300 and the backplane 200 are formed as one unit.

Figure 3A:
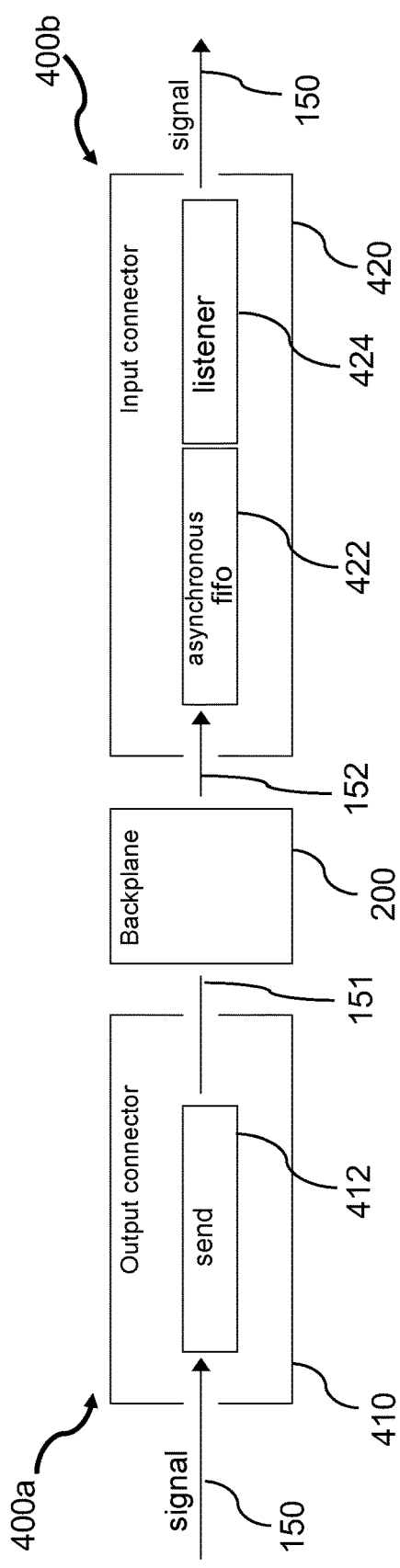
FIG. 3A, 3B depict further details of the messaging interface implemented in further embodiments.
Figure 3B:
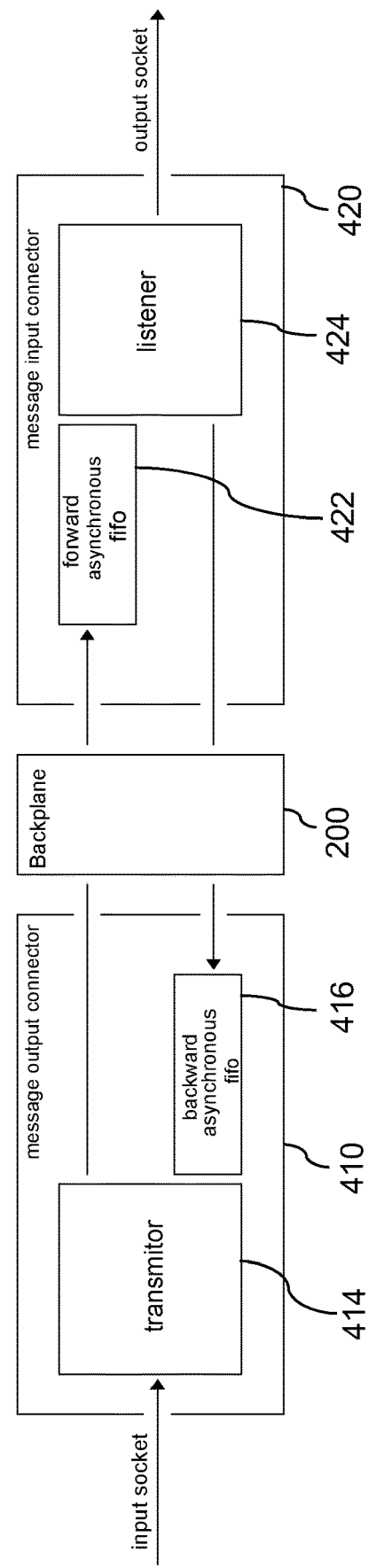

FIG. 3A, 3B depict further details of the messaging interface 400. All partitions 100 can be connected to the central backplane 200 via messaging interface connectors. For example, each messaging interface 400 may comprise an output connector 410 for sending data 150 and an input connector 420 for receiving data 150.

FIG. 3A illustrates the principles for an exemplary single connection which can be implemented directly using a single wire or a single bit. All connections between partitions 100 may be based on the same principles. According to embodiments, the inputs and outputs of the DUTs on the partitions 100 are connected to a specialized messaging interface connector 410, 420 and may include a module (sender) 412 that initiates a transaction (e.g., transmission of data 150) by sending the data 150 through the output connector 410. Data 151 from the output connector 410 are routed by the backplane 200 to the input connector interface 420 of the target module in another partition (not depicted in FIG. 3A).

According to embodiments, the platform ensures an independence from specific hardware interface implementations. For this, a generic message structure (e.g. the data 151, 152) is used for the communication via the backplane 200. The specific hardware interfaces (e.g. on the partitions 100 receiving/forwarding the data 150) are mapped to this generic structure. This mapping takes into account a possible need of crossing of several abstraction levels between pin levels of the register transfer logic (RTL) on the partitions 100 and the generic message structure utilized on the backplane 200.

In addition, more complex data structures may be transferred from a source partition (coupled to the output connector 410) to a target partition (coupled to the input connector 420). There, the transferred data is pushed into a target queue. For this, the input connector 420 may include an asynchronous FIFO buffer 422 (first-in-first-out queue) to handle the complex data structures with the generic message structure.

The FIFO buffer 422 may be formed directly at the entry of the target partition to prevent data from getting lost in case the source partition (coupled to the output connector 410) produces data faster than the target partition (coupled to the input connector 420) can process. This FIFO buffer 422 may be a multi-producer single-consumer implementation with variable size. This safely handles backpressure and ensures that no input data can get lost. To map a complex interface connection (e.g.: AXI bus, advanced extensible interface). The input connector 420 may further comprise a listener 424 configured to retrieve and to deliver the data from the FIFO buffer 422.

The listener 424 may poll the asynchronous FIFO 422 for available elements and may send them as signal.

FIG. 3B illustrates a transfer of more complex data structures to another partition utilizing the generic message structure of the backplane 200. Here, a data path may be needed in both directions. For example, a read request is sent in the forward path during a read access, and the read data returns via the backward path. To achieve this, according to embodiments, the output connector 410 includes backward asynchronous FIFO buffer 416 and a transmitter 414. The transmitter 414 may pack data from an input socket, may send it to the backplane 200 and may poll the backward FIFO 410 for responses. The input connector 420 may be formed as in FIG. 3A. However, the listener 424 is also configured to forward the data on the backward path from input connector 420 to the backplane 200 which is then routed to the backward asynchronous FIFO buffer 416 of the input connector 410 where the data is available for delivery to the return address of the read request.

For this, both sides of the connection should know about each other. According to embodiments, the connection is name-based. At the beginning of the simulation, an output connector 410 may receive the name of the destination of the message or data. This setup the forward direction. Before the output connector 410 starts a transaction, it registers itself at the destination connector (the corresponding input connector 420). In this way, the backward path will be established. In particular, all connectors 410, 420 can register each other so that each connector 410, 420 knows the names and addresses of all other connectors of the other partitions.

According to embodiments, the output/input connectors 410, 420 (Signal and Socket) can be used to cover all common hardware interfaces like AXI (advanced extensible Interface), AHB (advanced high-performance bus), SPI (serial peripheral interface) etc. Multiple connections between a single pair of partitions can be allowed and can be implemented by an instantiation of multiple pairs message interface connectors.

In order to ensure correct communication between several parallel-running components 100, the partitions 100 need to be synchronized.

Figure 4:
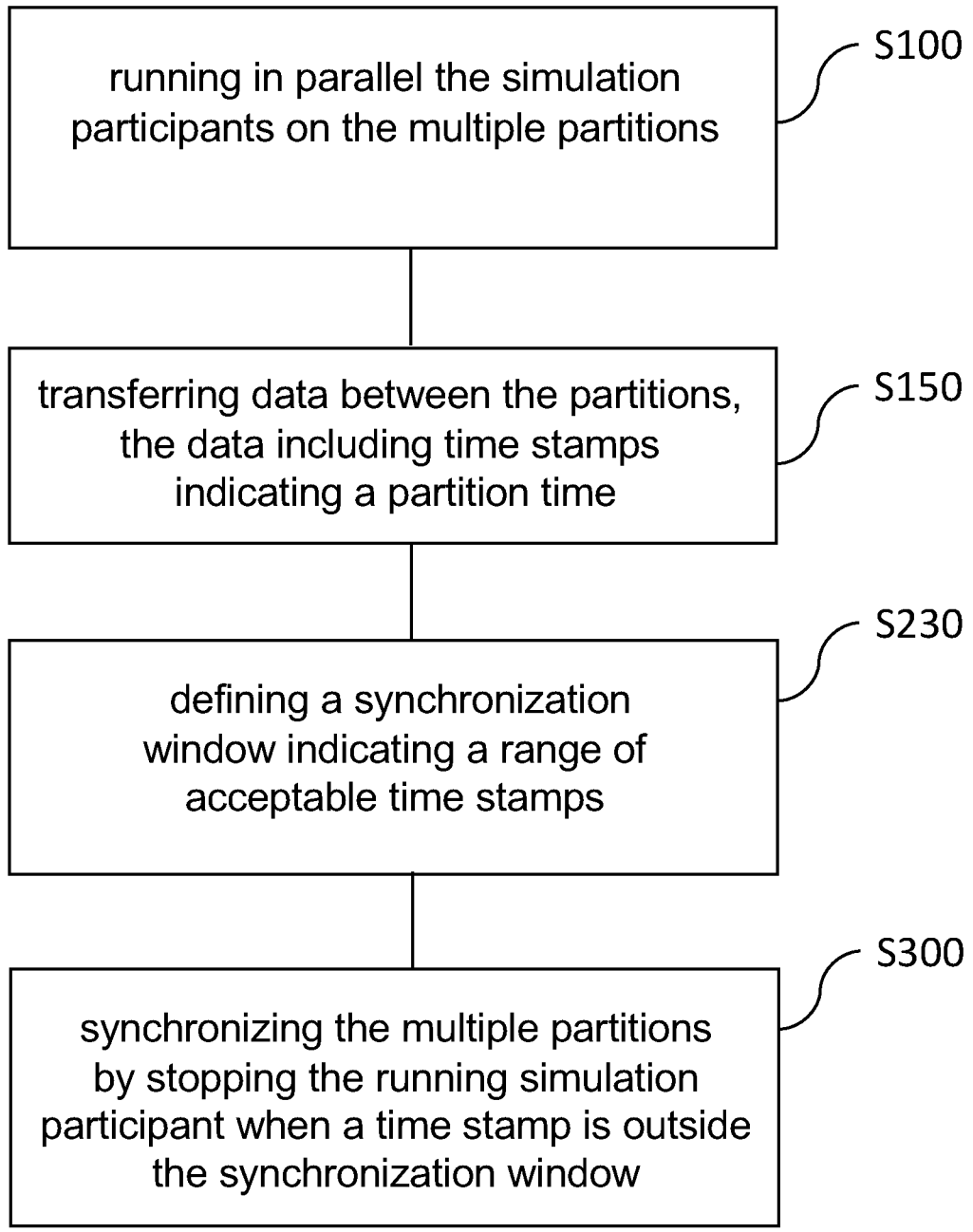
FIG. 4 schematically shows a flow chart of method according to embodiments.

FIG. 4 schematically shows schematically a flow chart of method 400 for synchronizing a simulation running on multiple partitions 100 of a heterogeneous complex system, wherein the simulation comprises simulation participants on the multiple partitions 100 that are connected by a backplane 200. The method comprises:

running S100 in parallel the simulation participants on the multiple partitions 100;

transferring S150 data 150 between the partitions 100, wherein the data 150 includes time stamps T1, T2, . . . indicating a partition time of a simulation participant on at least one partition;

defining S230 a synchronization window 310 of predetermined time length indicating a range of acceptable time stamps T1, T2, . . . ; and synchronizing S300 the multiple partitions 100 by pausing the running simulation participant of the at least one partition, when a time stamp T5 of the running simulation participant is outside the synchronization window 310.

Therefore, embodiments utilize the synchronization window 310 concept for loosely timed coupling of partitions 100.

The individual partitions 100 running in parallel do not necessarily have to be FPGAs 110, 120. Parallel to the hardware FPGA partitions 110, 120, one or more partitions with hardware emulations 130, 140, for example a SystemC Virtual Prototype, can also be connected to the backplane 200.

A person skilled in the art knows SystemC as an extension of the programming language C++. It can be used for simulations, because it allows to create an executable model of a system of an as-yet undefined combination of hardware, software and data flows between them. SystemC is implemented as a class library to add hardware modelling constructs, such as concurrency, clocks, modules and interconnections, to the core C++ language.

The usage of the synchronization window 310 allows to reduce the synchronization over-head. All schedulers within the partitions 100 can operate freely within the synchronization window 310. However, they are never more ahead or behind each other than allowed by the synchronization window parameter (e.g. its predetermined length). For example, if the synchronization window 310 is, according to embodiments, set to 10 ms no two partitions will ever be separated by more than 10 ms in time.

According to embodiments, all partitions 100 are connected to the synchronizer 300. The synchronization of the different simulation participants 100, both FPGA 110, 120 and the exemplary SystemC 130, 140, may be organized in a way where the different partitions run relative to each other in time. The progress of simulation time in individual partitions is controlled by the synchronizer 300.

According to embodiments, if a kernel on a partition 100 wants to update the current simulation time, it may get first an approval for the next time step by the synchronizer 300. The synchronizer 300 keeps the current times of all partitions 100 within the synchronization window 310.

If a partition 100 requests a time step T5 that is further in the future than the current simulation time TO of the slowest partition plus the value allowed by synchronization window 310 (cp. FIG. 1), the partition 100 will be put on hold and waits until the time stamp T5 is within the synchronization window 310 or until an external transaction arrives and wakes-up the partition 100. If any partition 100 stops the simulation, all sleeping partitions will be woken up and may gracefully finish the simulation.

The synchronization window 310 is a user parameter and should be determined by design analysis or experimentally. The value of the synchronization window 310 may be defined at the beginning of the simulation. This mechanism provides the advantage of allowing the user to de-couple the time between components in a controlled way. The synchronizer 300 implements a singleton that is atomically accessed by all kernels from all partitions 100.

Furthermore, according to embodiments, the number of partitions 100 is defined at the simulation start. This makes it possible to align all partitions at the beginning of the simulation. Otherwise it could happen that one partition is already finished before the other one is started.

During the simulation, whenever a partition is going to update the current simulation time, embodiments may use the backplane interface 200 to get the next time step approved by the synchronizer 300. The multi-partition simulation may run until one of the partitions 100 send a stop command to the synchronizer 300 (in the following also simply called synchronizer).

According to embodiments, each partition may register automatically at the synchronizer 300, may align with the other partitions 100 (so that all partitions begin the simulation at the same time) and may start the execution process.

The following figures illustrate further specific details of the method for synchronizing.

Figure 5:
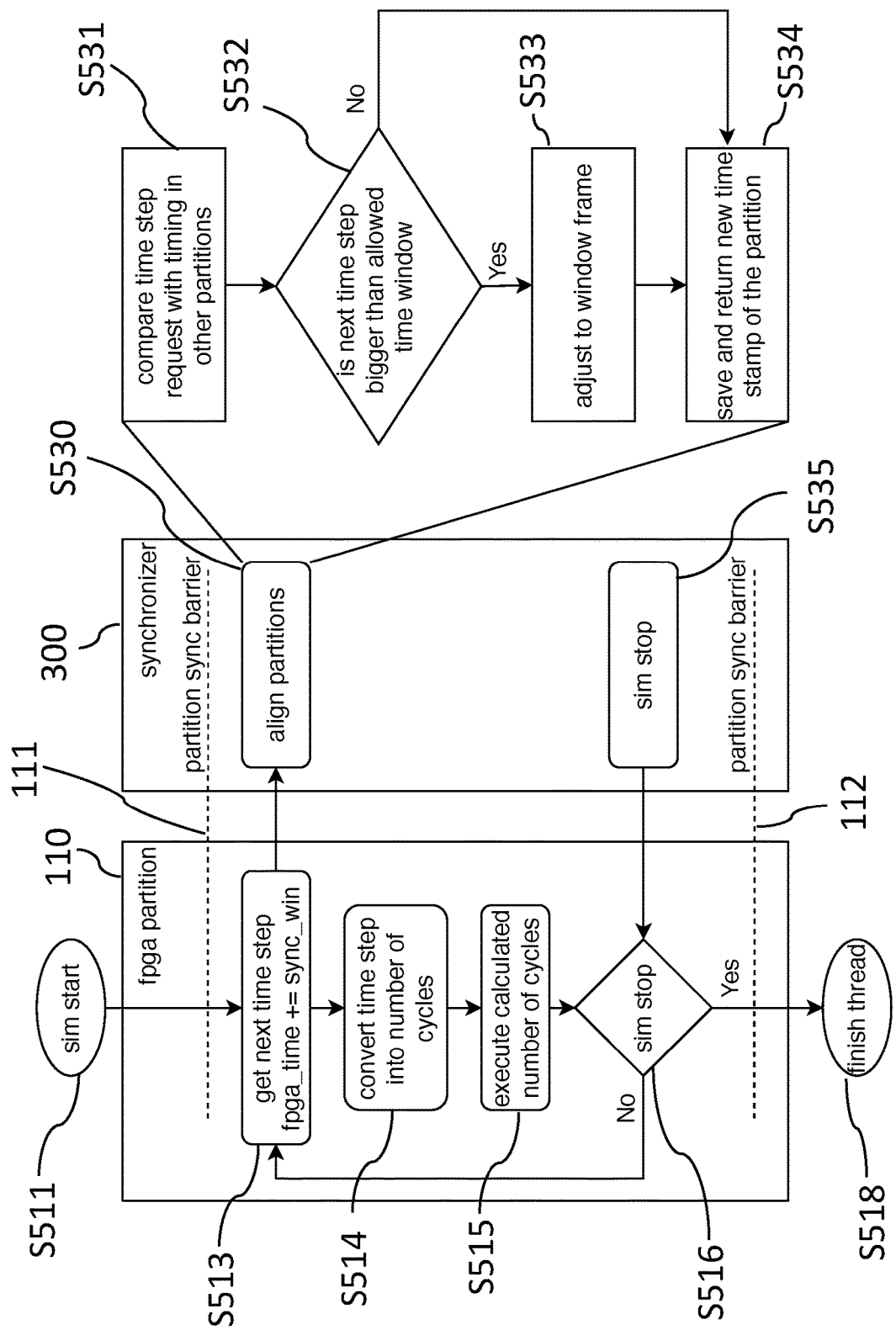
FIG. 5 illustrates the synchronization of FPGA partitions utilizing a synchronizer according to embodiments.

FIG. 5 illustrates synchronization of a FPGA partition 110 utilizing the synchronizer 300 according to embodiments. The dashed lines 111 indicates the enforced joined starting line (alignment) of the different partitions when the simulation starts. Similarly, the dashed line 112 indicates the end barrier where the simulation terminates. Between the synchronization points (dashed lines 111, 112) of the FPGA partition 110 and/or of the synchronization 300 may run freely.

At step S511, the FPGA partition 110 starts data processing on the exemplary FPGA partition 110. The first step in the execution loop synchronizes with other components (e.g. to achieve the desired alignment). For this, at step S513, the FPGA module/device 110 asks the synchronizer 300 for how long it is allowed to run and may request an approval of the next time step. At step S530, the synchronizer module 300 provides a time stamp, optionally together with the employed synchronization window 310. For this, at step S531, the synchronizer 300 compares the requested time step request with the timing in other partitions 120, 130, 140 to make sure that all partitions remain in the set synchronization window 310. At step S532, the synchronizer decides whether the next time step is bigger that the allowed time window (synchronization window 310) or not. If so, at step S533, the next time step is adjusted to the window frame of the synchronization window 310 and, at step S534, the time step is saved and the new time stamp is returned to the requested partition 110. If not, step S533 is skipped and the system goes directly to step S534.

Then, with the approval of the synchronizer 300, the FPGA partition 110 sets the FPGA time (at step S513) and, at step S514, converts it into a number of cycles, which are executed at step(s) S515. After execution of the number of cycles, the running simulation of the FPGA partition 110 decides whether or not the simulation can continue (at step S516). The simulation on the FPGA partition 110 will continue until a stop signal is received from the synchronizer at step S535.

If it shall stop, the FPGA partition 110 ends (finishes) the thread at step S518. If not, the simulation continues with reiterating steps S513, S514, S515 and S516 until the simulation shall stop.

Therefore, according to embodiments, the FPGA module (partition 110) asks the synchronizer 300 for how long it is allowed to run. The synchronizer 300 provides a time stamp and the DUT on the FPGA partition 110 may be executed for exactly the number of clock cycles to match the synchronizer time. The DUT execution period may then be blocked. As soon as it ends, the synchronization with other components (other partitions) will be performed again. This process is repeated until the synchronizer 300 stops the simulation. When there is nothing more to execute, the thread is put to sleep and is woken up either by a time update or by an input (e.g. a transaction package), or by the simulation stop.

Figure 6:
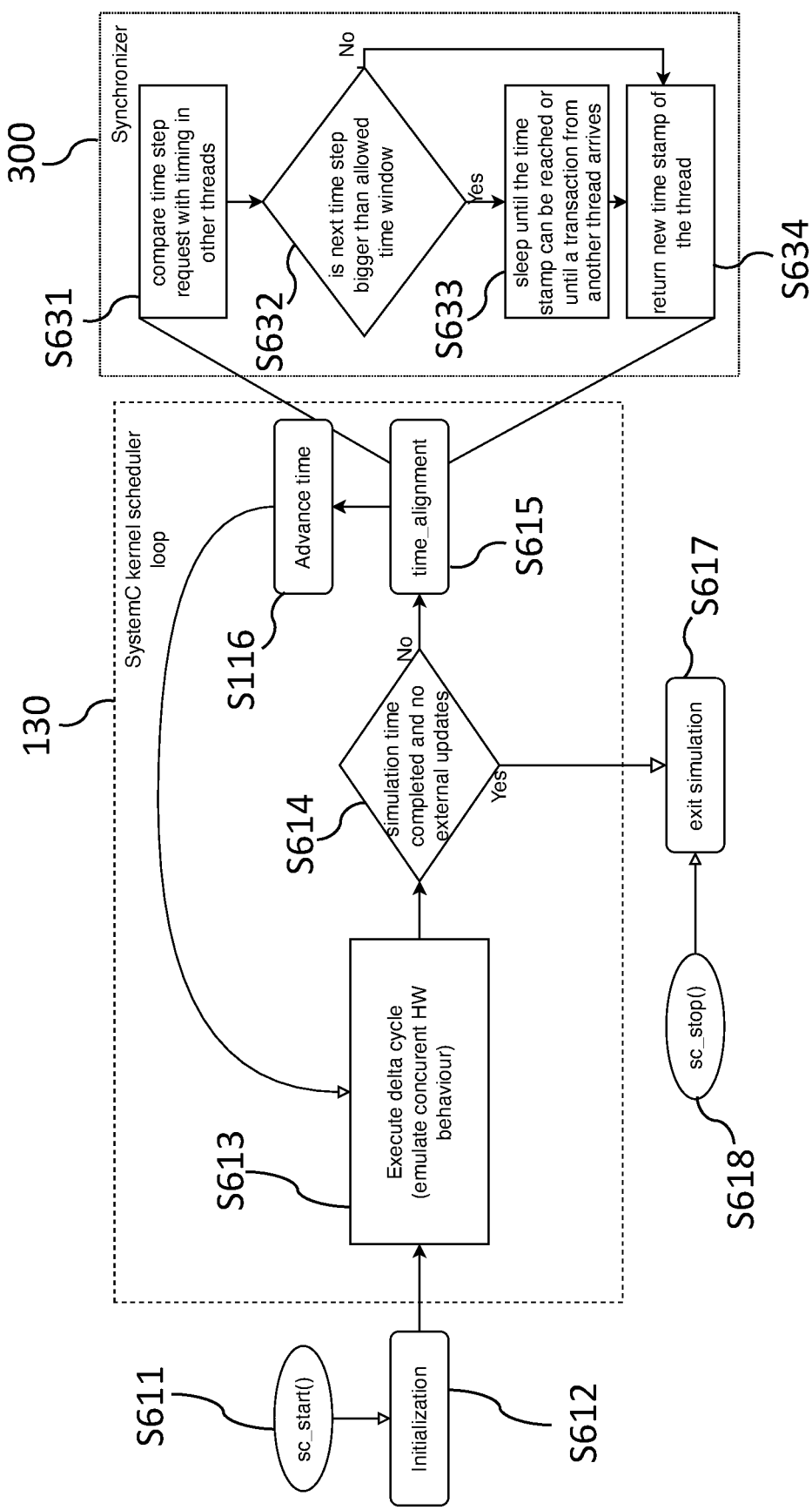
FIG. 6 illustrates a thread synchronization of virtual platform simulation partitions according to embodiments.

FIG. 6 illustrates a thread synchronization of a virtual platform simulation partition 130 (or partition 140) which may be a so-called SystemC partition providing a software simulation of the corresponding DUT. As in FIG. 5 the simulation starts at step S611. At step S612, an initialization is performed, and a scheduler of a kernel of the virtual platform on the partition 130 is executed thereafter, at step S613 (e.g. a delta cycle of the SystemC system). After this, at step S614, the scheduler decides whether the simulation time has finished or not. If so, the simulation exits at step S617 which may be associated with a corresponding (external) stop signal received at step S618.

If the simulation time at step S614 has not yet finished, a time alignment is carried out at step S615, which again includes a request to the synchronizer 300 to get an approval for the new time stamp. If this is received, the simulation continues to advance in time at step S616 and the delta cycle is again executed at step S613.

The time alignment at step S615 is performed similarly to the alignment as carried out for the FPGA partition 110 (see FIG. 5). During this procedure, the synchronizer 300 compares, at step S631, the requested time step with time steps of the other partitions 110, 120, 140. Thereafter, at step S632 the synchronizer 300 decides whether the next time step is bigger than the allowed time window 310. If so, at step S633, the simulation is set to a sleep until the time stamp is within the allowed synchronization window 310. Thereafter, the new time stamp is saved and returned to the partition 130 at step S634. If the synchronizer 300 decides that the next time step is not bigger than the allowed time window 310, step S633 of placing the simulation to a sleep is bypassed and the simulation goes directly to the return of the new time stamp to the time alignment step S615 of the partition 130.

This exemplary synchronization of a SystemC partition will ensure correct communication between several parallel-running components (partitions 110, 120, 130, 140). For example, an Accelera SystemC kernel may not provide this functionality (Accellera SystemC is a reference implementation of the SystemC language). If, according to embodiments, the SystemC kernel wants to update the current simulation time, it may have the next time step approved by the synchronizer 300. The synchronizer 300 keeps the current time of all partitions 110, 120, 130, 140 and a synchronization window 310.

For this, according to embodiments, the conventional Accellera SystemC scheduler may be extended to interact with the synchronizer 300. The Synchronizer 300 intervenes in the scheduler loop always before the timestamp is updated at step S616. Then (see step S631) the "desired" timestamp is compared with the current timestamps in the other partitions 110, 120, 140 so that the synchronization window 310 is not violated. If the desired timestamp cannot be reached without violating the synchronization window 310, the thread is put to sleep (at step S633) and woken up again as soon as the timestamp is allowed by the synchronizer 300.

Figure 7:
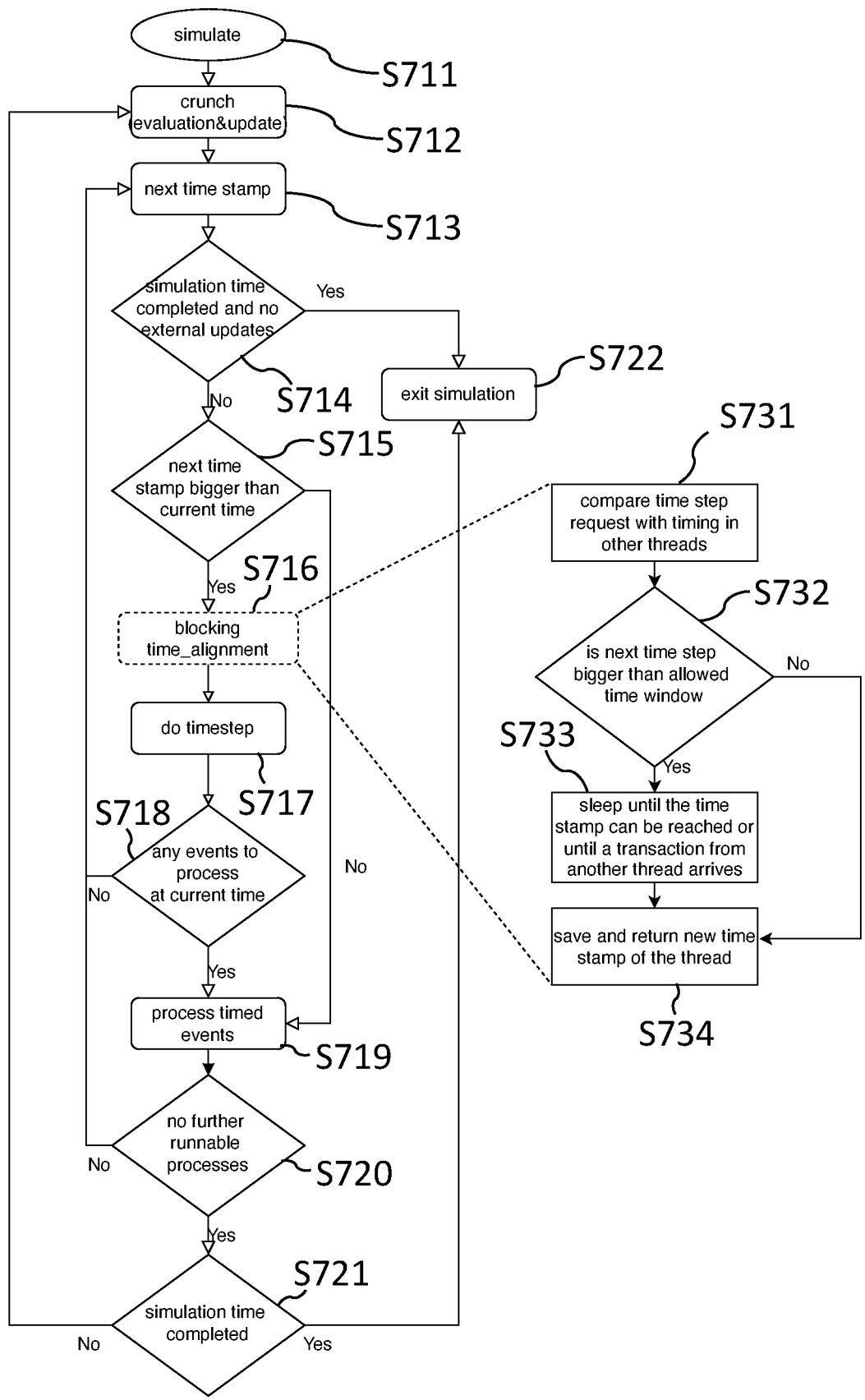
FIG. 7 illustrates the detailed synchronization flow of an exemplary SystemC partition according to embodiments.

FIG. 7 illustrates more details of the synchronization flow of the exemplary SystemC partition 130.

Again, the simulation starts at step S711, followed by step S712 with an evaluation and an update for the simulation time. At step S713, the next time stamp is received. At step S714, the system decides whether the simulation time is completed, and no external updates are available. If so, the simulation exits at step S722. If not, at step S715, the simulation decides whether the next time stamp is larger than the current time. If so, at step S716, the simulation again carries out a time alignment and, if not, the simulation proceeds with step S719 (to process the timed event).

This time alignment S716 includes again, at step S731, a comparison of the time stamp request with the timing in other threads. At step S732, the synchronizer 300 decides if the next time step is bigger than the allowed time window 310. If so, at step S733, the simulation is placed a sleep until the time stamp can be reached or until a transaction from another thread arrives. Thereafter, at step S734, the time step is saved and returned as a new time stamp to the thread. If the next time step is not bigger than the allowed time window at step S732, the step of placing the simulation at a sleep at step S733 is bypassed and the new time stamp is immediately returned to the simulation.

After the time alignment, at step S717, the time step is set and then, at step S718, the simulation decides whether any event is to be processed at the current time. If not, the simulation returns to step S713, and if so, the simulation processes, at step S719, the further events. Thereafter, at step S720, the simulation decides whether or not further runnable processes are available. If no runnable processes are available, the simulation completes at step S721. When there are still runnable processes, the simulation returns to step S713 or to step S718.

After completion of the simulation, at step S721, the simulation exits at step S722 if the simulation time is completed. If not, the simulation proceeds with step S712.

According to embodiments, when the exemplary SystemC kernel exits the simulation on the partition 130, all other partitions 110, 120, 140 will also shut down properly. Again, according to embodiments, an Accellera SystemC scheduler is extended to interact with Synchronizer 300 as set out before.

Figure 8:
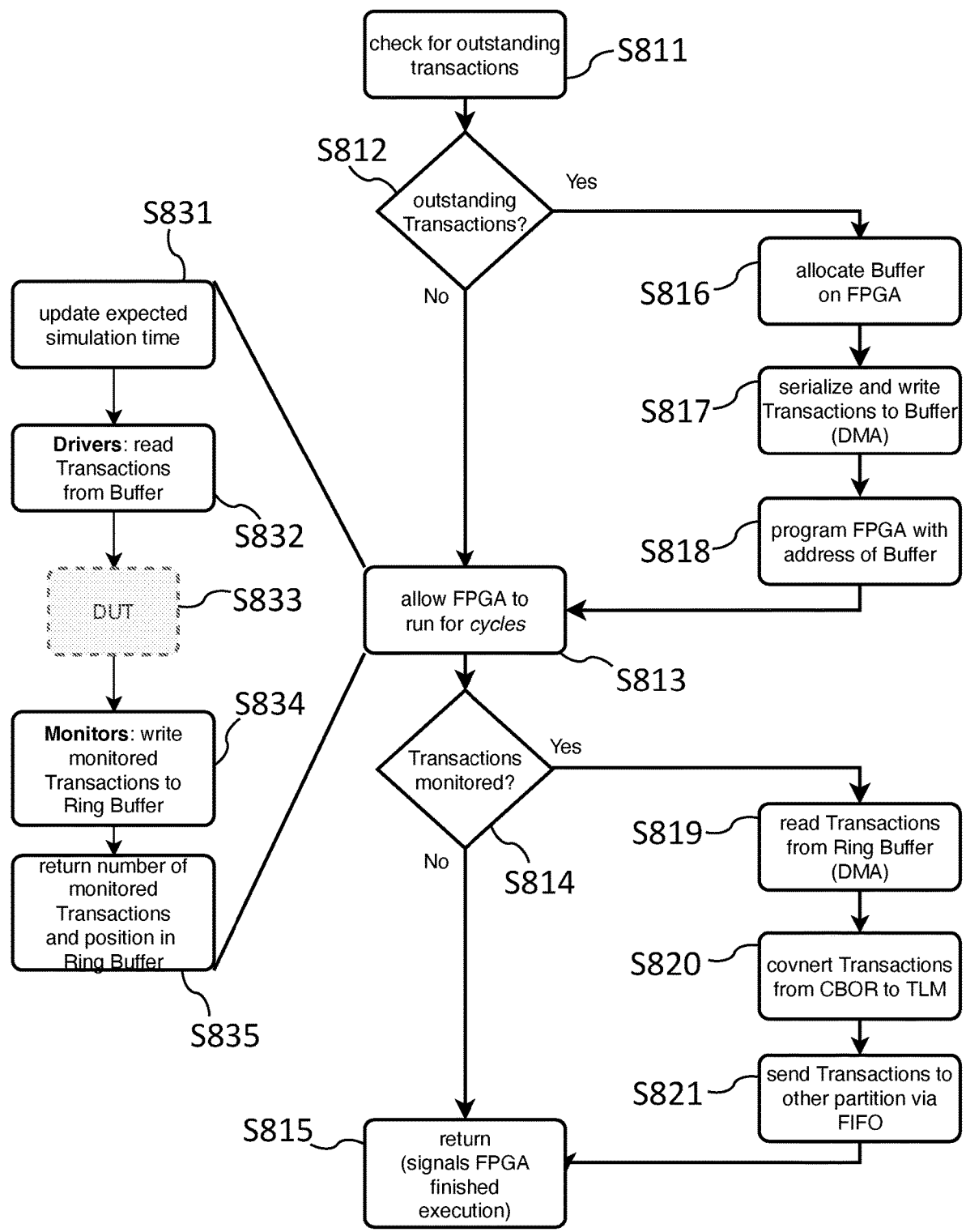
FIG. 8 illustrates an integration of the FPGA partition and an execution flow according to embodiments.

FIG. 8 illustrates an integration of the FPGA partition 110 and an execution flow. In the following, the term FIFO 422 includes a corresponding controller that manage the data buffering.

First, at step S811, the FIFO 422 is checked for outstanding input transactions from other partitions 120, 130, 140 to the DUT on the exemplary FPGA partition 110. If, at step S812, it is decided that there are any, they are transferred to the FPGA memory and the FPGA is adapted to locate the corresponding memory. Concretely, this is done by allocating buffer space on the FPGA partition 110 (at step S816) and to serialize and to write transactions to the buffer space (at step S817). The FPGA 110 is configured to have the address of the buffer space (step S818) available.

Then the FPGA 110 is informed, at step S813, about the amount of cycles it may run. Internally (see steps S831 to S835), the FPGA 110 will then update its expected simulation time (at step S831) and read the transactions from the memory (at step S832). While the FPGA runs until its simulation time matches the expected simulation time, drivers execute the transactions by applying the corresponding input signal transitions to the DUT (at step S833). Then, at step S834, monitoring devices watch the DUT's output signals to capture the transitions and convert them back into transactions. These transactions from the DUT are sent back to the Backplane (see next section). Monitored transactions are also written to a Ring Buffer (at step S834). When the current simulation time of the FPGA 110 reaches the expected simulation time it notifies the host about the completion of the task and returns the number of monitored transactions and their position in the Ring Buffer (at step S835).

At step S814, the FPGA 110 verifies whether transactions are monitored. If so, at step S819, transactions are read from the buffer space (e.g. ring buffer, e.g. a direct memory access, DMA, buffer). At step S820, the transactions are converted from CBOR (concise binary object representation) to TLM (transaction level modeling). At step 821, the transactions are sent to another partition 120, 130, 140 via FIFO. Therefore, the host reads these output transactions from the FPGA memory and sends them to the respective partition.

At the end, at step S815, the method returns to signal the completion of the task to the backplane 200.

According to embodiments, the integration of the FPGA partitions 110, 120 is implemented as follows. First, there are two types of information which are to be exchanged between the infrastructure and the FPGA partitions 110, 120:
1. Actual data transactions between partitions.
2. Timing information from the synchronizer 300: up to which simulation time of the FPGA partition 110, 120 is allowed to run independently.

Data transactions from other partitions 130, 140 to the DUT on the FPGA partition 110 are not directly sent, but instead are stored in a buffer 422 (e.g. a multiple producer single consumer, MPSC, FIFO as described with FIG. 3A, 3B). From there the data will be transferred to the FPGA partitions 110, 120 in batches. According to embodiments, this may be done each time the respective FPGA partition 110, 120 gets permission from the synchronizer 300 to continue the DUT execution (zoom-in into the "execute" block in FIG. 5).

Figure 9:
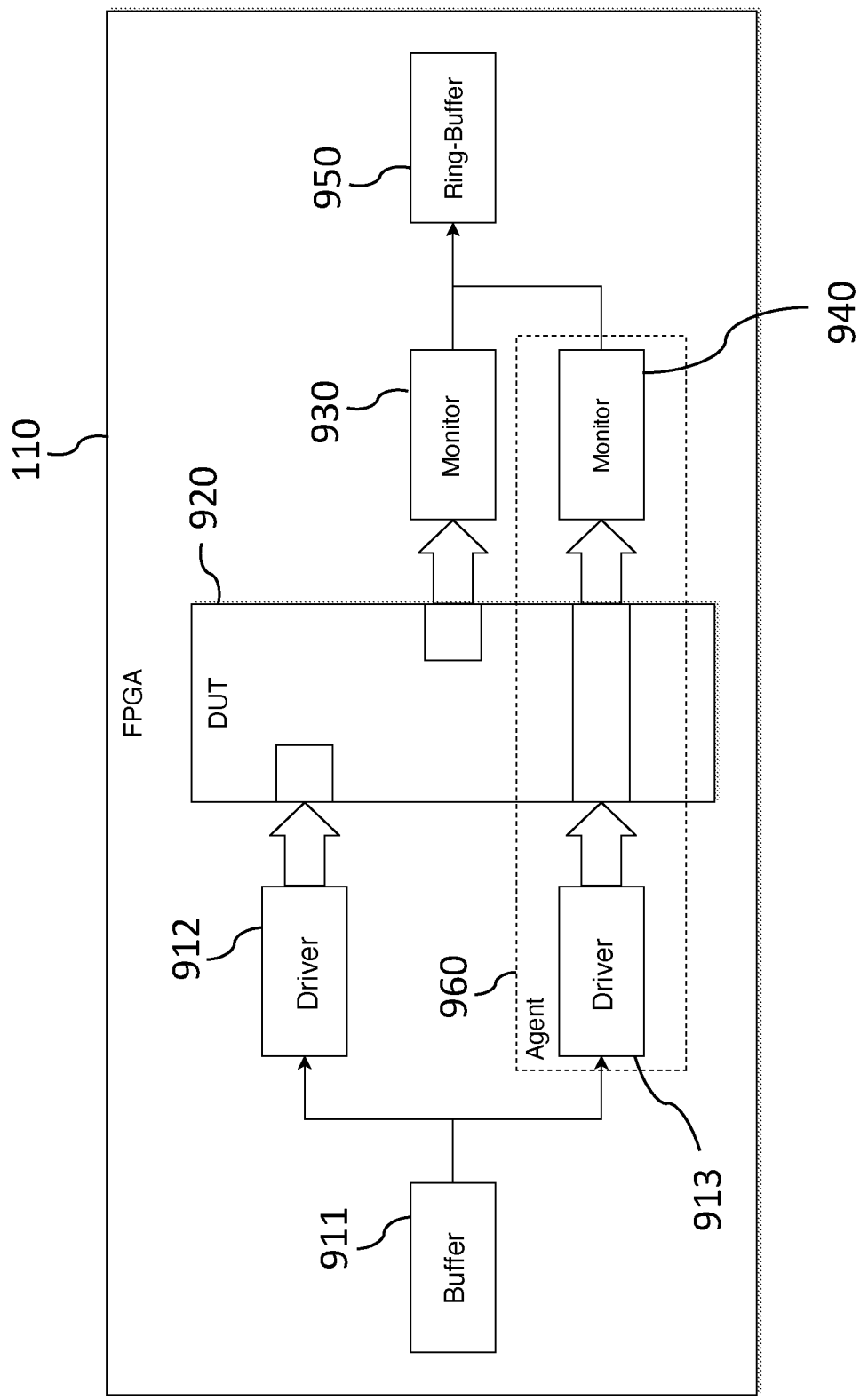
FIG. 9 shows an architecture for an FPGA partition according to embodiments.

FIG. 9 shows an exemplary architecture for an FPGA partition 110. The partition 110 includes a buffer 911, two drivers 912, 913 (or more), a device under test 920 (hardware implemented by the FPGA), two monitors 930, 940 (or more), and an exemplary ring buffer 950. The depicted hardware components may be utilized in the aforementioned methods.

Transactions, for example, can either be generated by other partitions 120, 130, 140 and consumed by the DUT 920 on the FPGA 110 or generated by the DUT 920 and consumed by the other partitions 120, 130, 140. Transactions generated by other partitions 120, 130, 140 will be handled by one of the drivers 912, 913 which converts them into signal transitions forwarded to the DUT 920. For the transactions generated by the DUT 920 at least one of the monitors 930, 940 watches the outgoing signals and generates output transaction objects accordingly. For each interface of the DUT 920 which consumes transactions, a driver 912, 913 is created. For each interface which generates transactions, a monitor 930, 940 is created. Some interfaces (e.g. AXI) can consume as well as produce transactions. For these interfaces a driver 913 and a monitor 940 are created. Together they may form an agent 960.

Embodiments provide at least the following advantages. For example, the method and the system allow a parallel simulation of large systems divided among several FPGAs and/or software threads. This infrastructure enables a parallel simulation of RTL on FPGA and Virtual Platforms on a host. Likewise, it allows simulations of ASIC (ASIC=application specific integrated circuit) designs that are so large that they do not fit on a single FPGA. The parallel infrastructure can be run on-premise, but optionally also in a cloud (remote server).

The description and drawings merely illustrate the principles of the disclosure. It will thus be appreciated that those skilled in the art will be able to devise various arrangements that, although not explicitly described or shown herein, embody the principles of the disclosure and are included within its scope.

Furthermore, while each embodiment may stand on its own as a separate example, it is to be noted that in other embodiments the defined features can be combined differently, i.e. a particular feature descripted in one embodiment may also be realized in other embodiments. Such combinations are covered by the disclosure herein unless it is stated that a specific combination is not intended.

Although the invention has been illustrated and described in detail by way of preferred embodiments, the invention is not limited by the examples disclosed, and other variations can be derived from these by the person skilled in the art without leaving the scope of the invention. It is therefore clear that there is a plurality of possible variations. It is also clear that embodiments stated by way of example are only really examples that are not to be seen as limiting the scope, application possibilities or configuration of the invention in any way. In fact, the preceding description and the description of the figures enable the person skilled in the art to implement the exemplary embodiments in concrete manner, wherein, with the knowledge of the disclosed inventive concept, the person skilled in the art is able to undertake various changes, for example, with regard to the functioning or arrangement of individual elements stated in an exemplary embodiment without leaving the scope of the invention, which is defined by the claims and their legal equivalents, such as further explanations in the description.

LIST OF REFERENCE SIGNS 100 partition(s)
110, 120 reconfigurable logic devices (e.g. FPGAs)
130, 140, . . . virtual platform simulation partition(s)
150 transferred data (e.g. messages)
200 backplane
300 synchronizer
310 synchronization window
400 messaging interface(s)
410 output connector(s)
412 sending device
414 transmitter
416, 422 (asynchronous) buffer (e.g. FIFO)
420 input connector(s)
424 listener
911, 950 buffer
912, 913 driver
920 device under test (DUT)
930, 940 monitors
960 agent
T0 time stamp of slowest running simulation part
T1, T2, . . . time stamps inside the synchronization window
T5 exemplary time stamp outside the synchronization window
A1, A2, . . . approval(s) of requests
R1, R2, . . . update requests

The invention claimed is:

1. An apparatus for synchronizing participants of a simulation of a chip design partitioned into parts, the apparatus comprising:
a plurality of partitions, each partition being configured to run a respective simulation participant independently from other simulation participants;
a backplane connecting the plurality of partitions and being configured to transfer data between the plurality of partitions, the data including time stamps indicating a partition time of a simulation participant on at least one partition; and
a synchronizer configured to synchronize the multiple partitions by stopping the running simulation participant of the at least one partition, when a time stamp of the running simulation participant is outside a synchronization window,
wherein the synchronization window has a predetermined time length indicating a range of acceptable time stamps and starts with a time associated with a time stamp of a slowest running simulation participant;
wherein the synchronizer is configured to issue an approval of a request for updating a simulation time of a simulation participant, when the updated simulation time is inside the synchronization window;
wherein all partitions are connected to the synchronizer which is configured to control the simulation time in all partitions;
wherein each partition comprises a scheduler, the scheduler being configured to schedule jobs of the respective simulation participant based on time stamps independently from other simulation participants; and wherein the synchronizer is configured to allow the scheduler of the partitions to freely schedule the jobs as long as the time stamps are inside the synchronization window.

2. The apparatus according to claim 1, wherein the backplane comprises the synchronizer and the plurality of partitions includes at least one of the following sets:
 a set of field programmable gate arrays, FPGA,
 a set of virtual platform simulation partitions.

3. The apparatus according to claim 1, wherein the synchronizer is configured to allow a stopped simulation participant to resume its operation upon receiving an external transaction.

4. The apparatus according to claim 1, further comprising one or more messaging interfaces to provide connections between the partitions and the backplane, the messaging interfaces include an output connector and an input connector for mapping a generic message structure of the backplane to a design-specific interfaces of the respective partitions.

5. The apparatus according to claim 4, wherein each partition comprises a corresponding messaging interface, wherein each messaging interface is configured:
 to receive, at the output connector at a beginning of the simulation, a name of the input connectors being possible destinations of messages; and/or
 to register the output connector at the input connector.

6. The apparatus according to claim 4, wherein each input connector comprises an asynchronous buffer to buffer data and provide them when the respective partition needs the buffered data.

7. The apparatus according to claim 1, wherein the synchronizer is configured to cause at least one of the following:
 to define or to determine a number of simulation participants,
 to register each simulation participant,
 to align all simulation participants at a beginning of the simulation.

8. The apparatus according to claim 1, wherein the synchronizer is adapted to use as or to set the predetermined time length of the synchronization window to at most 25 ms or at least 5 ms or about 10 ms.

9. A computer-implemented method for synchronizing a simulation of a chip design partitioned into parts, the simulation running on multiple partitions of a heterogeneous complex system, the simulation comprising simulation participants on the multiple partitions, the method comprising:
 running in parallel the simulation participants on the multiple partitions;
 transferring data between the partitions, the data including time stamps indicating a partition time of a simulation participant on at least one partition;
 defining a synchronization window of predetermined time length indicating a range of acceptable time stamps;
 synchronizing the multiple partitions by pausing the running simulation participant of the at least one partition, when a time stamp of the running simulation participant is outside the synchronization window, wherein the synchronizer is configured to issue an approval of a request for updating a simulation time of a simulation participant, when the updated simulation time is inside the synchronization window, and wherein all partitions are connected to the synchronizer module which is configured to control the simulation time in all partitions;
 scheduling jobs of the respective simulation participant based on time stamps independently from other simulation participants by a scheduler comprised in each partition, and
 allowing the scheduler of the partitions to freely schedule the jobs as long as the time stamps are inside the synchronization window.

10. The method of claim 9, wherein at least one step is carried out by a remote cloud computing unit.

11. A non-transitory computer-readable storage medium with stored instructions adapted, when carried out on a data processing unit to carry out the method of claim 9.

* * * * *